(12) United States Patent
Liu et al.

(10) Patent No.: US 10,276,648 B1
(45) Date of Patent: Apr. 30, 2019

(54) PLASMA TREATMENT FOR THIN FILM RESISTORS ON INTEGRATED CIRCUITS

(71) Applicant: Texas Instruments Incorporated, Dallas, TX (US)

(72) Inventors: Kaiping Liu, Plano, TX (US); Imran Mahmood Khan, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/855,576

(22) Filed: Dec. 27, 2017

(51) Int. Cl.
*H01L 21/00* (2006.01)
*H01L 49/02* (2006.01)
*H01L 21/321* (2006.01)
*H01L 21/3213* (2006.01)
H01L 27/11509 (2017.01)
H01L 27/11507 (2017.01)

(52) U.S. Cl.
CPC .......... *H01L 28/24* (2013.01); *H01L 21/3211* (2013.01); *H01L 21/32138* (2013.01); *H01L 27/11507* (2013.01); *H01L 27/11509* (2013.01)

(58) Field of Classification Search
CPC ........... H01L 21/3211; H01L 21/32138; H01L 21/02315; H01L 21/0234; H01L 27/228; H01L 28/24; H01L 29/42356; H01L 29/4238

USPC .............................................................. 438/3
See application file for complete search history.

(56) References Cited

U.S. PATENT DOCUMENTS 6,054,359 A * 4/2000 Tsui .................... H01L 27/0629
257/E21.004
6,086,960 A * 7/2000 Kim ....................... C23C 16/56
427/255.394
9,455,312 B2 9/2016 Liu et al.

\* cited by examiner

*Primary Examiner* — David S Blum
(74) *Attorney, Agent, or Firm* — Jacqueline J. Garner; Charles A. Brill; Frank D. Cimino (57) ABSTRACT

A method of fabricating ICs including thin film resistors (TFRs) depositing a dielectric liner layer on a substrate including a semiconductor surface having a plurality of IC die formed therein each including functional circuitry comprising a plurality of interconnected transistors. A TFR layer comprising chromium (Cr) is deposited on the dielectric liner layer. The TFR layer is plasma treated with atomic nitrogen and atomic hydrogen. A dielectric capping layer is deposited on the TFR layer after the plasma treating. A pattern is formed on the capping layer, and the TFR layer is etched to form at least one resistor that comprises the TFR layer.

20 Claims, 9 Drawing Sheets

PLASMA TREATMENT FOR THIN FILM RESISTORS ON INTEGRATED CIRCUITS

FIELD

This Disclosure relates to plasma processing of thin film resistors for integrated circuit (IC) devices.

BACKGROUND

Some IC devices include thin film resistors (TFRs). Silicon Chromium (SiCr) has been used for years for TFRs due to its high electrical resistance in thin film form, relatively low temperature coefficient of resistance (TCR), and the ability to carry relatively high current densities. For some process flows there can be earlier formed temperature sensitive circuitry on the IC that imposes a low thermal budget requirement for TFR fabrication that can degrade the TFR's electrical characteristics and thermal stability.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include methods of fabricating ICs including TFRs comprising plasma treating the TFR layer with atomic nitrogen and atomic hydrogen. At least one dielectric liner layer is deposited on a substrate including a semiconductor surface having a plurality of IC die formed therein each including functional circuitry comprising a plurality of interconnected transistors. A TFR layer is deposited on the dielectric liner layer. The TFR layer is plasma treated with atomic nitrogen and atomic hydrogen. A dielectric capping layer is deposited on the TFR layer after the plasma treating. A pattern is formed on the capping layer, and the TFR layer is etched to form at least one resistor that comprises the TFR layer.

BRIEF DESCRIPTION OF THE DRAWINGS

Reference will now be made to the accompanying drawings, which are not necessarily drawn to scale, wherein.

DETAILED DESCRIPTION

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed processing recognizes integrating TFRs into a process flow where there is a low thermal budget requirement for TFR formation due to temperature sensitive circuitry already being on the IC can result in the inability to obtain desired electrical characteristics, such as that of low TCR TFR. For example, a process flow low that has a thermal budget requirement is one including ferroelectric random access memory (FRAM) devices which is a form of non-volatile memory that has the features of high-speed writing, low-power consumption and high endurance that are formed before the TFRs. However, disclosed TFR processing is generally helpful for all semiconductor fabrication processes that form ICs having TFRs which are limited to only low temperature backend of the line (BEOL) processing.

Disclosed processing provides precise control of TFR electrical properties allowing tighter electrical specification control, and thus IC performance. This Disclosure solves this problem by providing a plasma treatment to the TFR layer which introduces specific amounts of atomic nitrogen and atomic hydrogen, and optionally other atomic or ionic gas species to passivate the dangling bonds and stuff the grain boundaries of the TFR layer, which can increase the thermal stability of the TFRs. Low TCR TFRs are also provided, having a TCR value <25 ppm/° C., such as 5 to 15 ppm/° C.

The disclosed plasma treatment in the presence of atomic nitrogen and atomic hydrogen reduces the TFR film components' (e.g., Si and Cr) reactivity to radicals (O, Cl, F) in the subsequent dielectric deposition plasma or TFR etch plasma, by passivating dangling bonds. A dielectric capping layer (e.g., silicon oxide) is then deposited that covers the TFR layer surface before TFR layer patterning and etch/clean steps. The dielectric capping layer protects the TFR surface from exposure to the when present bottom anti-reflectant coating (BARC), photoresist, and radicals within plasma generated by subsequent processing (e.g., TFR plasma etch or TFR plasma ash). In contrast, for known thermal furnace annealing of TFR, the controlling of TFR electrical characteristic and chemical property is typically obtained by optimizing the gas species flow and/or temperature of the annealing ambient. However it is recognized that controlling these factors is not effective in fine tuning/adjusting the TFR layer sheet resistance or the TFR's TCR, and/or are not effective in stabilizing the TFR layer' atomic bonds to prevent excessive etching/reaction with the etchant during the TFR etch and during post-TFR etch clean processes which can cause loss of TFR line-width control, including photoresist ashing.

Figure 1:
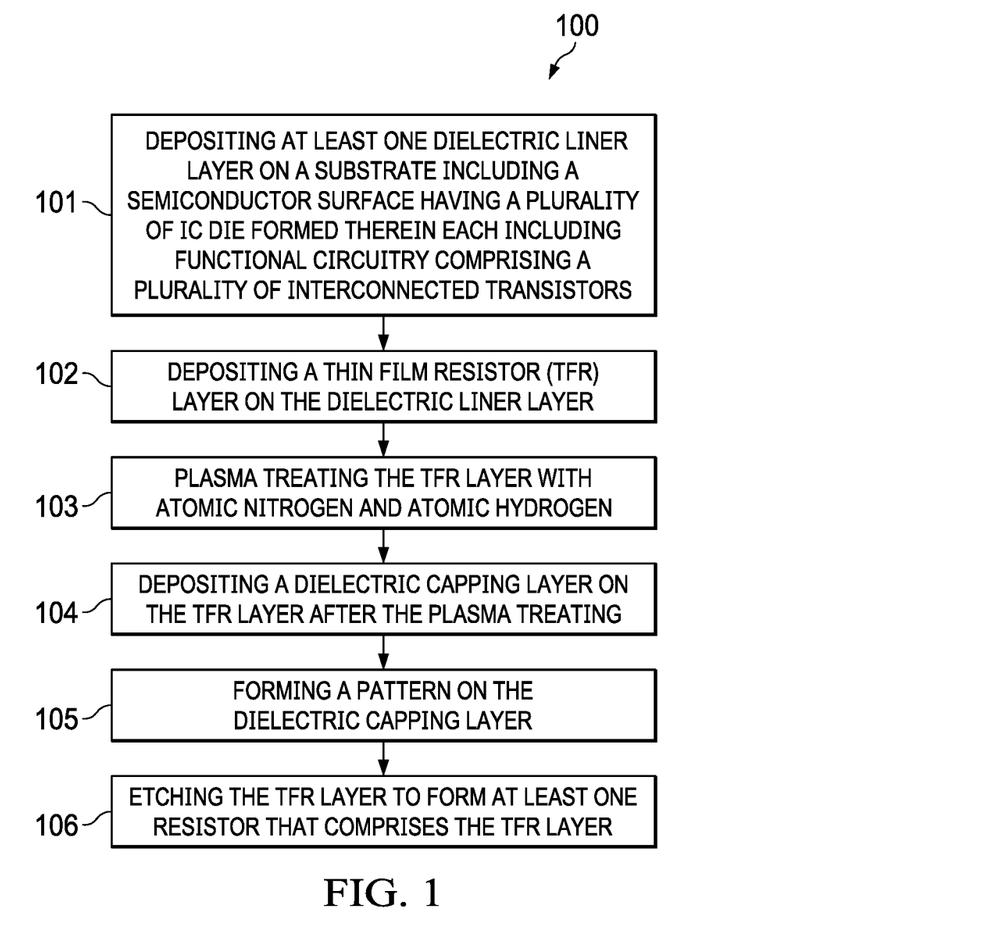
FIG. 1 is a flow chart that shows steps in an example method of fabricating ICs including TFRs comprising plasma treating the TFR layer with atomic nitrogen and atomic hydrogen, according to an example aspect.

FIG. 1 is a flow chart that shows steps in an example method 100 of fabricating ICs including TFRs comprising plasma treating the TFR layer with atomic nitrogen and atomic hydrogen, according to an example aspect. Step 101 comprises depositing at least one dielectric liner layer on a substrate (e.g., a wafer) including a semiconductor surface having a plurality of IC die formed therein each including functional circuitry comprising a plurality of interconnected transistors. The functional circuitry (see functional circuitry 212b in FIGS. 2A-2O described below) is generally formed in the substrate before forming the TFRs. Functional circuitry as used herein realizes and carries out a desired functionality, such as that of a digital IC (e.g., digital signal processor) or analog IC (e.g., amplifier or digital to analog converter), and in one embodiment a BiCMOS (MOS and Bipolar) IC. The capability of functional circuitry provided on a disclosed IC may vary, for example ranging from a simple device to a complex device. The specific functionality contained within functional circuitry is not of importance to disclosed ICs.

The substrate can comprise a bulk substrate material such as silicon, or an epitaxial layer on a bulk substrate material. Alternatively, the substrate can comprise silicon-germanium, other Group 4 material, or other semiconductor materials including III-V and II-VI compound semiconductor materials.

The dielectric liner layer can comprise a tetraethoxysilane (TEOS)-derived silicon oxide layer. However, other dielectric layers can also be used including deposited silicon oxides such as comprising organosilicate glass (OSG), low-k dielectric, doped dielectric layers such as fluorine-doped silica glass (FSG), a boron and phosphorous doped TEOS (BPTEOS) layer, or SiN and its variants such as SiON.

Step 102 comprises depositing a TFR layer on the dielectric liner layer. The deposition can comprise DC or radio frequency (RF) sputtering process. The TFR layer can comprise SiCr or its alloys such as SiCCr, SiCOCr, NiCr or its alloys such as NiCrFe (e.g., 61 atomic % Ni, 15% Cr, 24% Fe), TaN or TiN. The thickness of the TFR layer is generally 1 nm to 50 nm, such as 2 nm to 10 nm, or about 4 nm in one specific embodiment.

Step 103 comprises plasma treating the TFR layer with atomic nitrogen and atomic hydrogen in a plasma chamber. A temperature range of 250 to 500° C. may be used for the plasma treating. The pressure range used for plasma treating the TFR is generally 1 to 5 Torr. For example, an $NH_3$, $N_2$ plasma pre-treatment of the TFR layer surface in a PECVD chamber can be performed prior to an in-situ TEOS deposition in the same chamber that can serve as both the plasma chamber and the deposition chamber. The total RF power can be 600 to 1,000 Watts. In one arrangement the RF power is applied using a first RF frequency between 100 kHz and 1 MHz and at least a second RF frequency between 4 MHz and 20 MHz.

The gas used in the plasma chamber is typically $NH_3$ and $N_2$, with optional Ar, $O_2$, or He, but other gases can be used. Different combination of these gases will produce different percent combinations of atomic N, atomic H, Ar+, atomic O, and He+. For example, one can flow $NH_3$ and $N_2$ each with a flow rate between 1,000 to 8,000 sccm for 15 seconds at 375 to 425° C. at 700 to 900 Watts of total RF power.

The 2 different RF frequencies can be referred to as LF and HF. In one specific example, the HF can be at 13.56 MHz and the LF at 250 KHz. HFRF is used to generate the plasma or control the plasma density, while LFRF is used to control the ion energy accelerating to the substrate or the energy of the ion impact on the wafer surface. LF is used to compact or densify the TFR layer, and provide ions more energy to react with surface atoms. The LFRF power can be at a power of 440 to 520 watts (e.g., 480 watts) and the HFRF power can be at a power of 280 to 360 watts (e.g., 320 watts). The pressure used during the plasma treating will mainly determine the number of radicals, with higher pressure generating more radicals.

Known art of annealing of TFRs in a conventional furnace does not have the conditions needed produce radical or ionic species. Some of these radicals (or optionally also ions such as Ar+) generated by disclosed plasma treatment can react with dangling silicon and chromium bonds of the TFR layer in the case of SiCr and stabilize the reactivity of these bonds. Other of these species together with an enabling plasma power setting (such as 700 to 900 total Watts of power), with LFRF and/or HFRF power such as 480 watts and 320 watts, respectively, can be used for physical bombardment of the TFR surface by stuffing the grain boundary to stabilize the grain boundary or by compacting the TFR layer thus raising the TFR layer density. Thus, a disclosed advantage is that one can have more than two controlling factors to adjust the properties of the TFR film, allowing fine tuning/adjusting of the TFR film physical or chemical properties to achieve different objectives, such as fine tuning of the TFR resistivity or prevent excessive etching/reaction with the etchant during TFR etch and post-etch clean processing.

The plasma treatment time can be for 5 to 60 sec. Commercial plasma equipment (e.g., Applied Materials ENDURE) can generally be used. However, it is recommended to perform the plasma treatment in a dielectric deposition PECVD plasma chamber because one can combine the plasma treatment and dielectric deposition (a thin oxide capping layer), in one step, thus improving the process and time efficiency.

Step 104 comprises depositing a dielectric capping layer (e.g., TEOS-derived silicon oxide) on the TFR layer after the plasma treating. This process can comprise low pressure chemical vapor deposition (LPCVD) at a pressure of about 300 mTorr and at a temperature of about 700° C. for a TEOS deposition process. Plasma enhanced CVD (PECVD) can be used for a lower temperature capping layer deposition (e.g., 450° C., or below).

The dielectric capping layer thickness range can be 50 A to 300 A, such as about 100 A. Step 103 can be an in-situ process in the same depositing system used for depositing a dielectric capping layer on the TFR layer (step 104) when the dielectric capping layer deposition tool includes a plasma source. One example apparatus that can be used for steps 103 and 104 is a Novellus, Inc. PECVD system that includes a plasma source.

The dielectric capping layer can more generally comprise silicon oxide, oxynitride, or nitride. The type of dielectric is generally chosen based on what plasma chamber is most cost effective in the production line. The type of dielectric chosen can also be based on the dielectric material interaction with the TFR layer physical/chemical/electrical properties.

Step 105 comprises forming a pattern on the dielectric capping layer. Photoresist with a BARC layer may be used for forming this pattern. However, photoresist without a BARC layer can be used for non-precision TFRs. Step 106 comprises etching the TFR layer to form at least one resistor that comprises the TFR layer. Chlorine gas-based etchants are typical etchants used. The etchant gases used can be $O_2/Cl_2/BCL_3/CHF_3$, with Ar also optionally included.

The patterning material is then removed. Photoresist can be removed by ashing in $O_2$. One can use ashing to remove metallic polymer and followed by wet photoresist clean which typically involved Sulfuric Peroxide Mixture (SPM). It can sometimes be possible to skip the ashing and use only a wet photoresist clean.

Features of disclosed methods of fabricating ICs including TFRs using plasma treatment of the TFR layer with atomic nitrogen and atomic hydrogen include improvement of Line Edge Roughness (LER) of the TFR. The capping layer reduces TFR body erosion, thus enabling achieving a minimum TFR line width, such as about 0.175 μm. The capping layer also increases process margin by allowing a longer TFR etch to minimize residual TFR material, while helping to prevent TFR body erosion or LER. The capping layer allows a longer $O_2$ ash process to minimize polymer on TFR body, while preventing $O_2$ reaction with the TFR thus increasing the polymer removal rate.

Figure 2A:
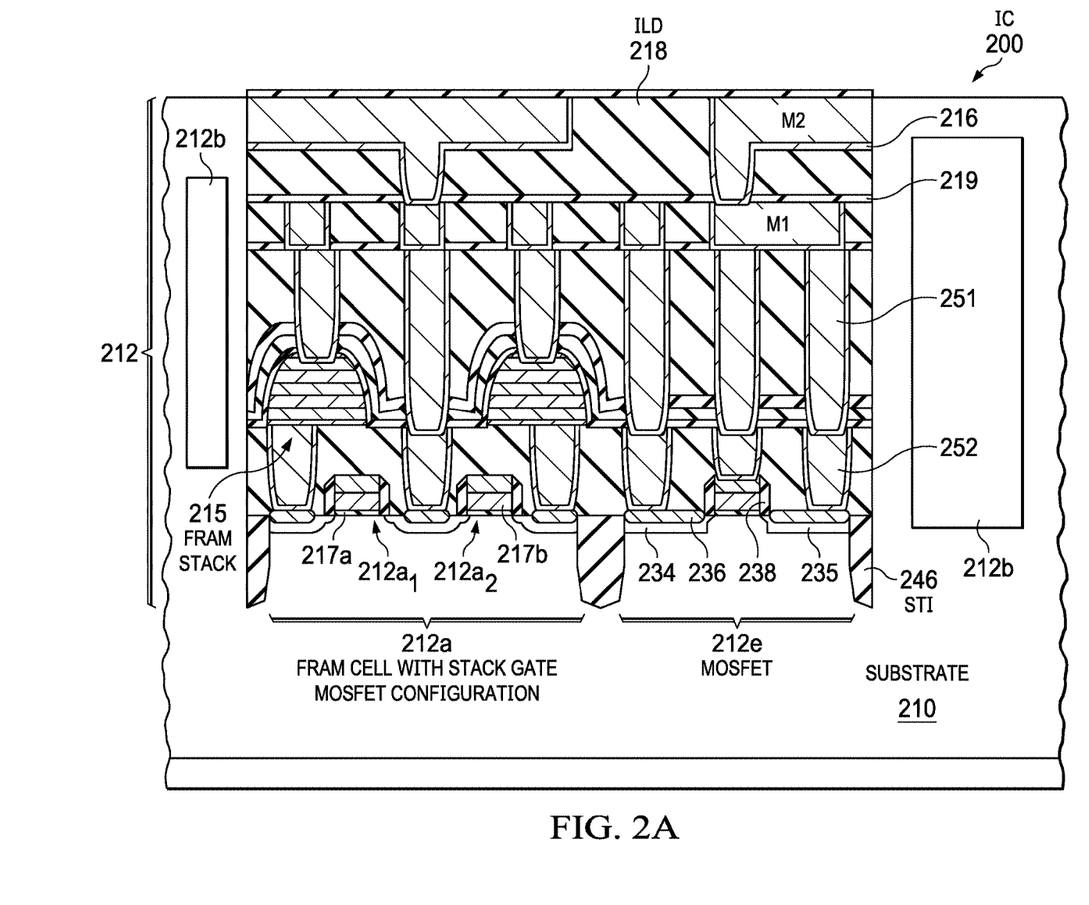
Figure 2B:
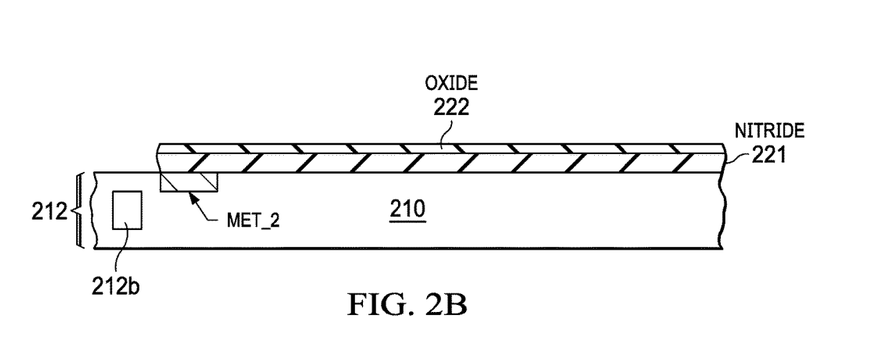
FIGS. 2B-2O are cross-sectional diagrams showing processing progression for an example method of forming at least one TFR on an IC including plasma treating the TFR layer with atomic nitrogen and atomic hydrogen on the in-process IC shown in FIG. 2A, according to an example aspect.
Figure 2C:
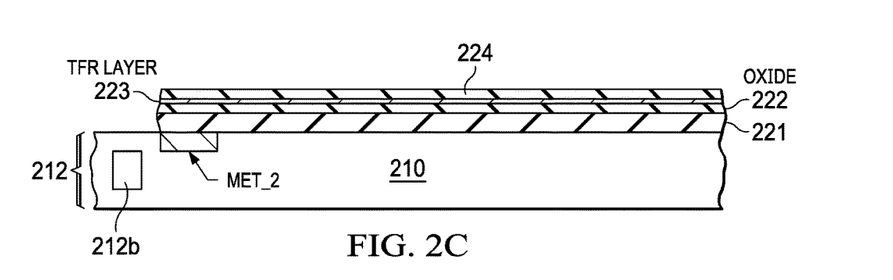
Figure 2D:
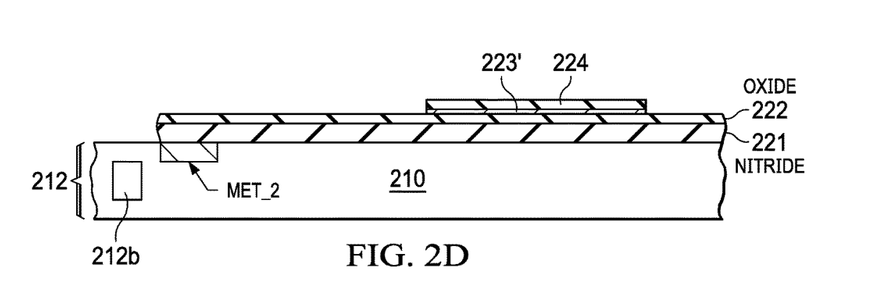
Figure 2E:
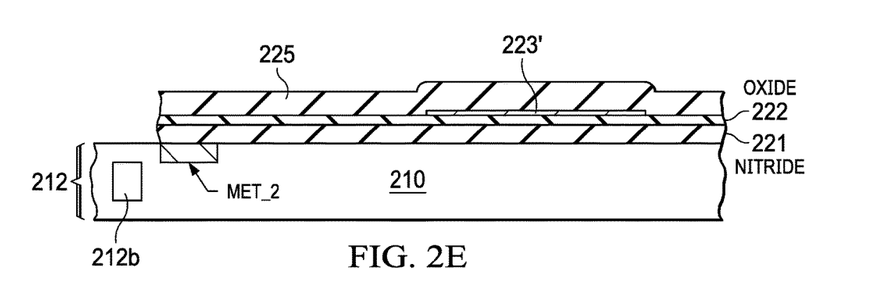
Figure 2F:
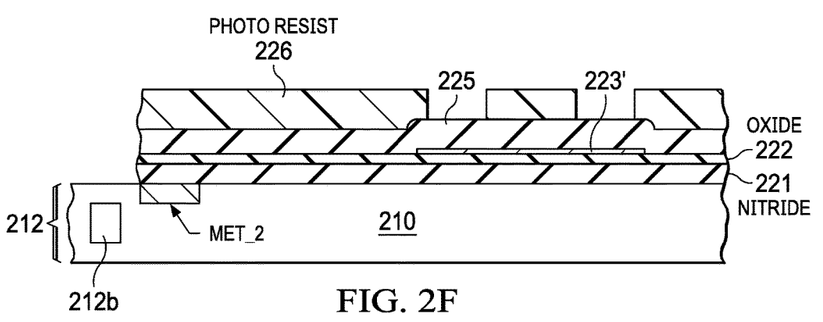
Figure 2G:
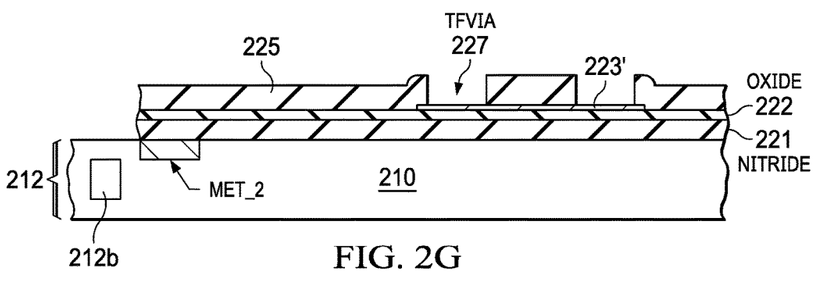
Figure 2H:
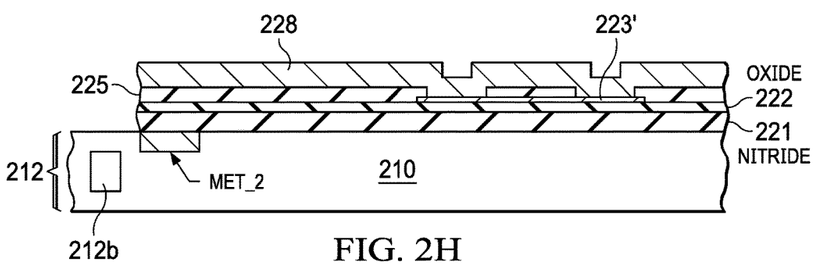
Figure 2I:
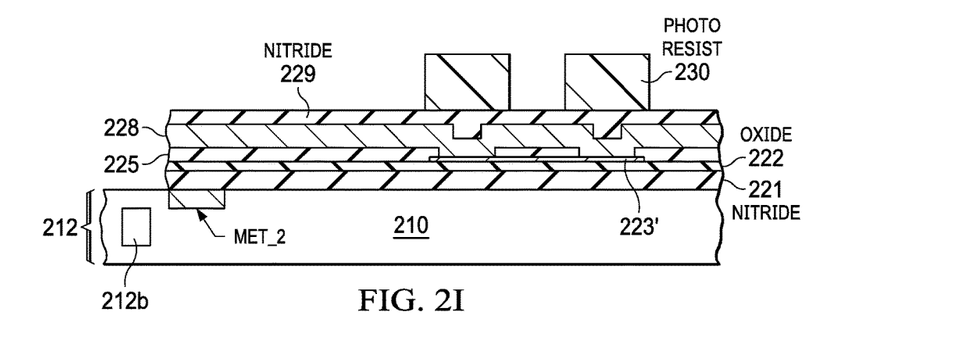
Figure 2J:
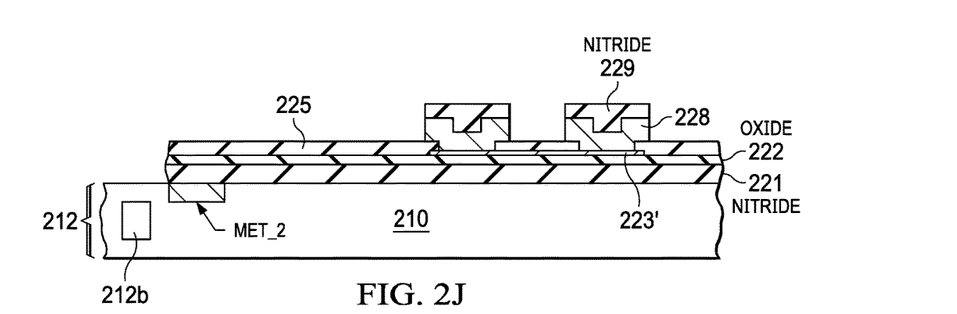
Figure 2K:
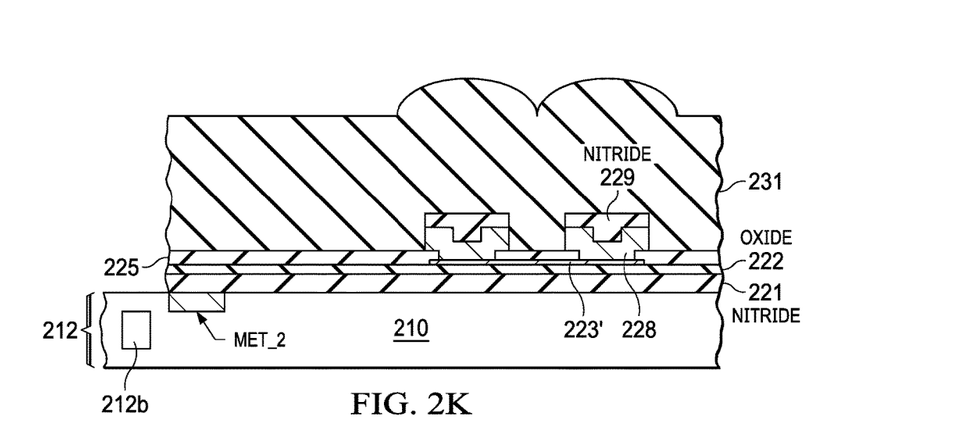
Figure 2L:
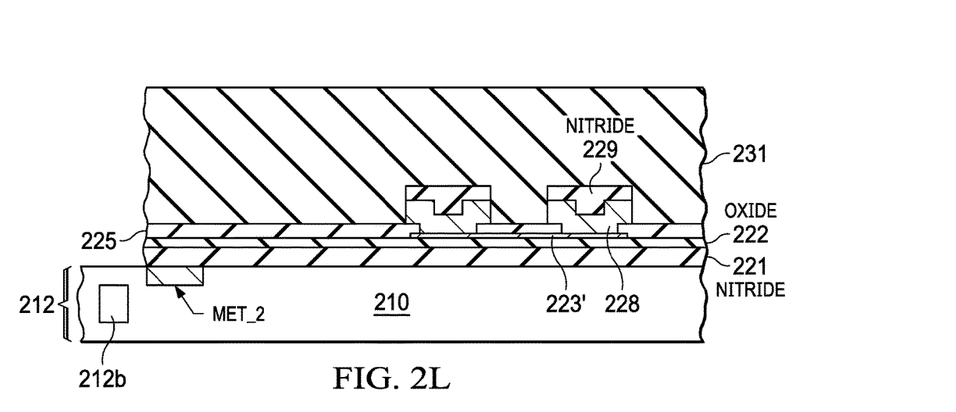
Figure 2M:
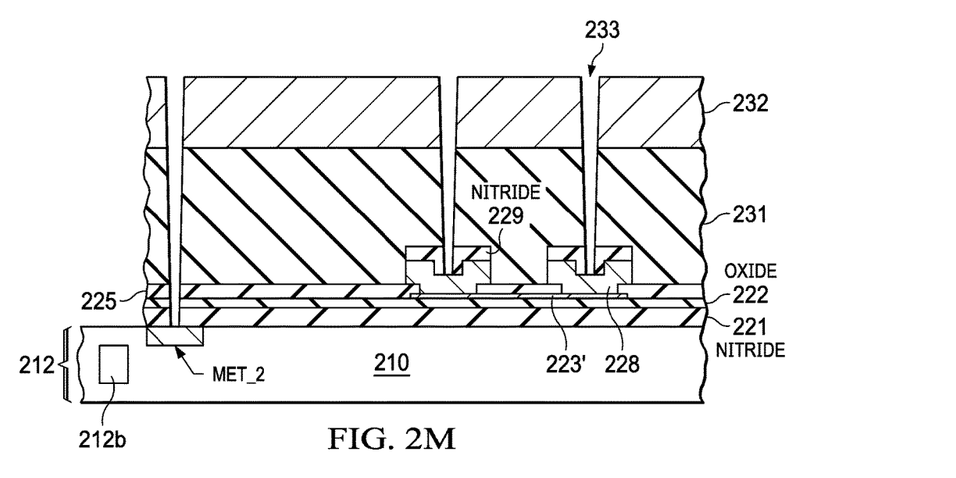
Figure 2N:
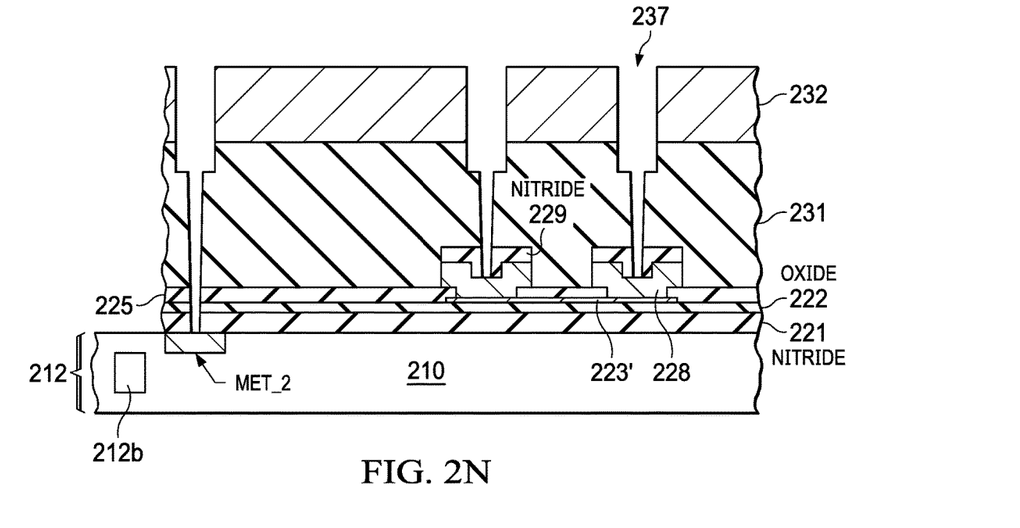
Figure 2O:
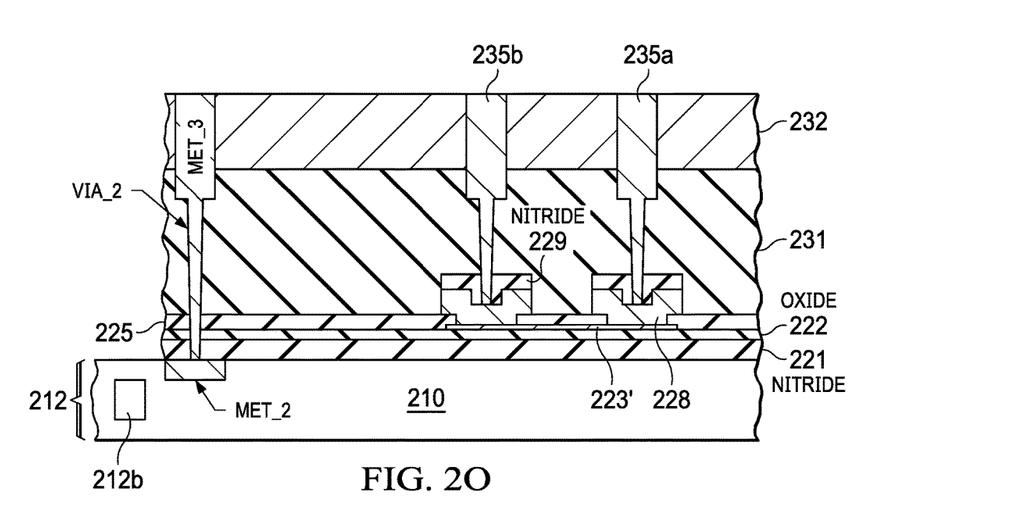

FIGS. 2B-2O are cross-sectional diagrams showing processing progression for an example method of forming an at least one TFR on an IC including plasma treating the TFR layer with atomic nitrogen and atomic hydrogen on the in-process IC 200 shown in FIG. 2A, according to an example aspect. Although the process flow described relative to FIGS. 2B-2O uses a copper backend, this Disclosure is also applicable to an aluminum backend, and one can use TiN instead of TaN. Moreover, the TFR can be formed at any intermetallic dielectric, not just between the metal 2 (M2) and M3 layers as described below.

FIG. 2A shows IC 200 having processing layers 212 shown on a semiconductor substrate 210 that represent multiple layers formed during front end processing that have been deposited or formed in prior preformed conventional semiconductor processing steps. In the layers 212, the prior processing steps may form various devices such as transistors including MOS transistors, bipolar transistors, FETs, as well as diodes, resistors, inductors, capacitors and the like, interconnected using metal layers and inter-metal dielectric (ILD) layers, the metal layers being connected to one another and to the substrate using via and contacts to connect the layers as are known to those skilled in the art. The processing layers 212 are shown including a FRAM cell with a stacked gate MOSFET configuration 212a connected to the FRAM cell comprising MOSFETs $212a_1$ and $212a_2$ as one of many memory elements on the IC and functional circuitry 212b. A single MOSFET shown in FIG. 2A as MOSFET 212e is used to represent the functional circuitry 212b shown in FIG. 2A being on both sides of the FRAM cell.

Functional circuitry 212b is generally integrated circuitry that realizes and carries out a desired functionality, such as that of a digital IC (e.g., digital signal processor) or analog IC (e.g., amplifier or digital to analog converter), such as a BiMOS IC. The capability of functional circuitry provided may vary, for example ranging from a simple device to a complex device. The specific functionality contained within functional circuitry is not of importance to disclosed embodiments. The top layer shown in FIG. 2A is M2 formed in an ILD 218, where M2 is shown on a barrier layer 216 (e.g. comprising Ta/TaN) and is connected by a M2 via to M1. An etch stop layer under ILD 218 is shown as 219. M1 is connected to via connection 251 which connects to a contact 252, both of which can comprise W. Dielectric isolation is shown as shallow trench isolation (STI) 246.

The components of the FRAM include a FRAM stack 215, such as comprising an Ir/lead zirconate titanate (PZT)/Ir stack. The MOSFET 212e is shown including a gate electrode 217b (e.g. a polysilicon gate) on a gate dielectric layer 217a, with a source 234 and a drain 235. Silicide 236 is shown over the gate electrode 217b and over the source 234 and drain 235. Gate sidewall spacers are shown as 238, such as comprising silicon nitride.

FIG. 2B shows the in-process IC after depositing at least one dielectric liner layer (step 101) shown as a liner silicon oxide layer 222 over a silicon nitride layer 221 which functions as an etch stop layer that may also comprise SiCN. The silicon oxide layer 222 thickness can be about 500 A. The silicon nitride layer 221 can be about 400 to 600 A thick.

FIG. 2C shows the in-process IC after depositing a TFR layer 223 then a dielectric capping layer 224 on the at least one liner silicon oxide layer 222. The FIG. 2C view corresponds to the in-process IC after Step 103 comprising plasma treating the TFR layer with atomic nitrogen and atomic hydrogen and step 104 comprises depositing a dielectric capping layer 224 (e.g., a TEOS-derived silicon oxide layer) on the TFR layer 223 after the plasma treating. As described above, there can be an in-situ plasma pretreating of the TFR layer 223 including at flowing least atomic nitrogen source and at least one atomic hydrogen source while in the dielectric capping layer deposition tool before depositing the dielectric capping layer 224.

FIG. 2D shows the in-process IC after etching the dielectric capping layer 224 and TFR layer 223 now shown as a patterned TFR layer 223' using a pattern generally provided by photolithography and etch process to define TFRs. This etch stops in the liner silicon oxide layer 222 which corresponds to after step 105 comprising forming a pattern on the dielectric capping layer and step 106 comprising etching the TFR layer 223 to form at least one resistor that comprises the TFR layer (patterned TFR layer 223'). FIG. 2E shows the in-process IC after removing the capping layer 224 over the patterned TFR 223' layer, followed deposition of an ILD2 layer 225. The ILD 2 layer 225 generally comprises a deposited silicon oxide layer, such as being about 1,500 A thick.

FIG. 2F shows the in-process IC after forming a TFR via pattern with PR 226, and FIG. 2G after etching TF vias 227 through the ILD2 layer 225 to reach the surface of the patterned TFR layer 223'. FIG. 2H is a view of the in-process IC after forming a TF head layer 228 such as comprising Ta/TaN to create a landing pad for later formed vias over the TFR. The reason the TF head is generally needed is that a normal metal/interconnect via cannot be landed on a thin patterned TFR layer 223' (e.g., typically 2 nm to 10 nm thick) without risking TFR layer punchthrough. Thus, one creates a thicker TF head for a normal metal/interconnect via to land on.

FIG. 2I shows the in-process IC after forming a silicon nitride layer 229 then a PR 230 layer providing a pattern for beginning to define the TF head. FIG. 2J shows the in-process IC after etching the silicon nitride layer 229, TF head layer 228 and stripping of the PR 230 to define a completed intermediate TFR structure.

FIG. 2K shows the in-process IC after depositing another ILD layer 231. FIG. 2L shows the in-process IC after chemical mechanical polishing (CMP) of the ILD layer 231 to planarize the ILD layer 231. FIG. 2M shows the in-process IC after depositing a capping layer 232 (e.g., silicon oxide) then forming via 233 through the full thickness of the capping layer 232 and ILD layer 231 including clearing the nitride layer 221 to open a via to MET2 and nitride 229 to open a via to the TF head layer 228 of the TFR. FIG. 2N shows the in-process IC after trench define and etch with the trench over via now shown as 237. FIG. 2O shows the in-process IC after seed deposition, copper plating then copper CMP to form copper via lands 235*a*, 235*b* for contacting respective ends of the patterned TFR 223' and for contacting MET2 on the IC.

The IC is completed by forming one or more other metal levels including a top metal level. The top metal layer can comprise aluminum (or aluminum alloy) or copper. Passivation overcoat (PO) then generally follows, followed by patterning the PO. The PO layer comprises at least one dielectric layer such as silicon oxide, silicon nitride or SiON.

EXAMPLES

Disclosed aspects are further illustrated by the following specific Examples, which should not be construed as limiting the scope or content of this Disclosure in any way.

TFR resistors comprising SiCr about 40 A thick were all formed on a dielectric layer on a silicon substrate for the data described in this Example. TFR resistors were formed having a width of 5.3 µm, 1.05 µm, and 0.175 µm. Some wafers with TFRs received disclosed post-TFR processing comprising an in-situ $NH_3/N_2$ plasma anneal for 15 seconds at 350° C. with 800 W total RF power having LFRF power at 480 watts and 250 KHz and HFRF power at 320 watts at 13.56 MHz. A silicon oxide capping layer deposition followed using TEOS resulting in a capping layer thickness of about 100 A, with standard post TFR Etch $O_2$ ash being a control group for comparison received baseline (BL) post-TFR formation processing without any anneal due to a low temperature requirement, with same silicon oxide capping layer deposition and the same post TFR etch $O_2$ ash conditions as for the disclosed processing.

Figure 3A:
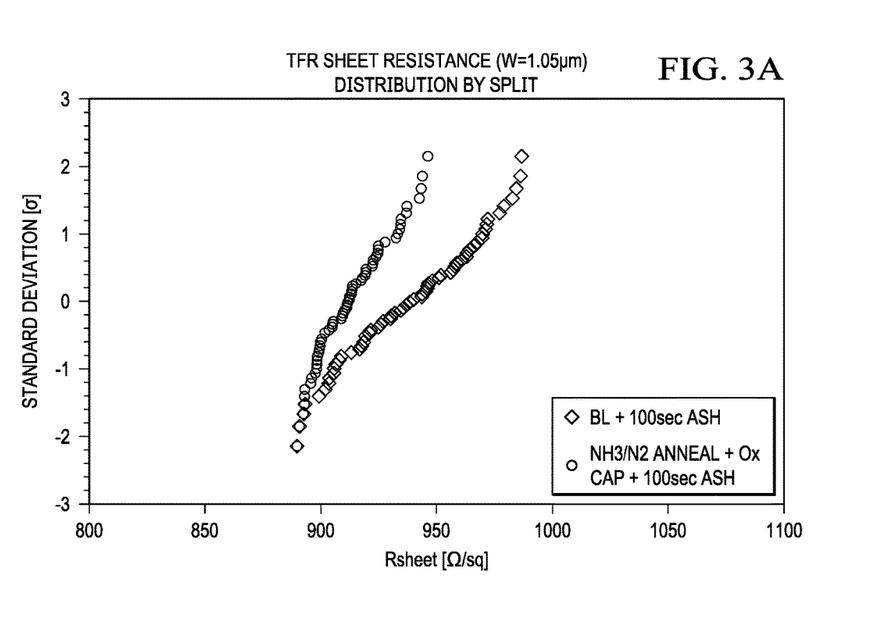
FIGS. 3A, 3B and 3C provide TFR results comparing results obtained from disclosed plasma treating the TFR layer to results obtained from baseline alternative TFR processing.
Figure 3B:
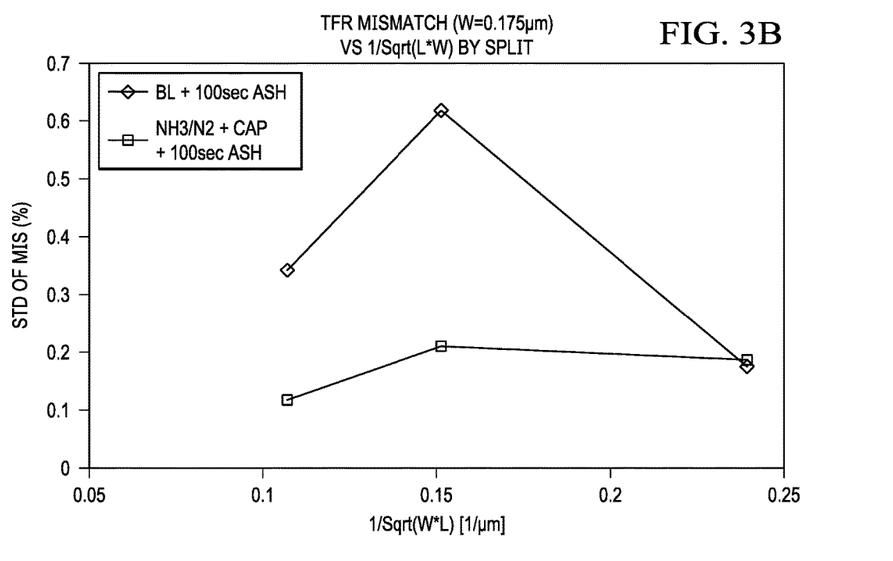

FIG. 3A shows a comparative sheet resistance (Rs) distribution by split (group) for TFRs having a 1.05 µm width. A tighter TFR resistance distribution is shown. FIG. 3B shows a plot of the standard deviation of the TFR mismatch vs. a TFR geometry parameter shown comprising 1/(the square root of the width(W)*length (L) of the TFRs) evidencing a significantly reduced standard deviation. A constant and low Rs mismatch is shown across the TFR sizes.

Figure 3C:
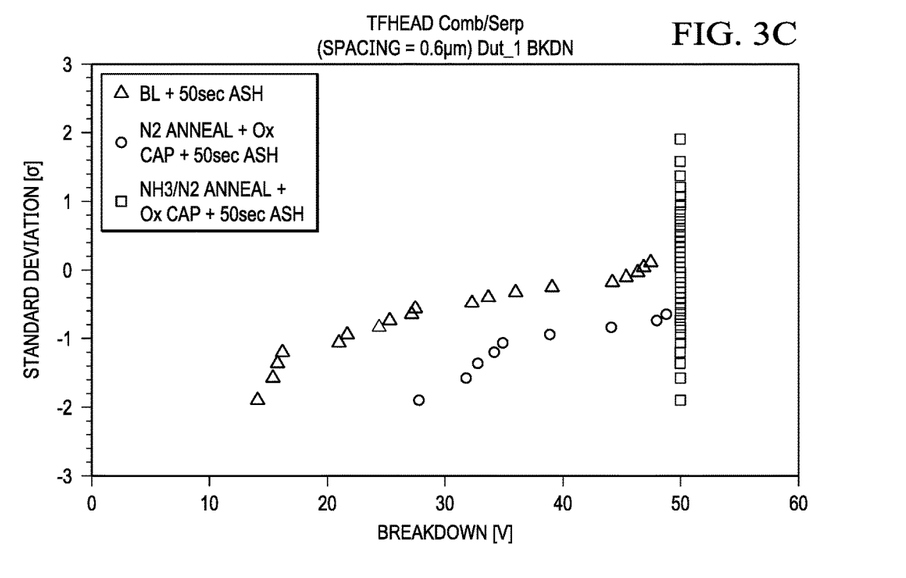

FIG. 3C shows a plot of the standard deviation for the breakdown voltage (breakdown in the dielectric material between adjacent TFRs) for disclosed post-TFR formation processing comprising an in-situ $NH_3/N_2$ plasma anneal for 15 seconds at 350° C. with 800 W total RF power, then a silicon oxide capping layer deposition using TEOS resulting in a thickness of about 100 A, then a 50 second $O_2$ ash. One control group received BL post-TFR formation processing without any anneal, with same silicon oxide capping layer deposition and the same 50 second O2 ash as for the disclosed processing, and another control group received TFR formation processing without $N_2$ furnace anneal, then the same silicon oxide capping layer deposition using TEOS resulting in a thickness of about 100 A, then the same 50 second $O_2$ ash as for the disclosed processing.

Disclosed aspects can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other aspects are possible within the scope of the claimed invention, and further additions, deletions, substitutions and modifications may be made to the described aspects without departing from the scope of this Disclosure.

The invention claimed is:

1. A method of fabricating an integrated circuit (IC), comprising:
   depositing at least one dielectric liner layer on a substrate including a semiconductor surface layer;
   depositing a thin film resistor (TFR) layer on said dielectric liner layer;
   plasma treating said TFR layer with atomic nitrogen, and atomic hydrogen;
   depositing a dielectric capping layer on said TFR layer after said plasma treating;
   forming a pattern on said dielectric capping layer, and
   etching said TFR layer to form at least one resistor that comprises said TFR layer.

2. The method of claim 1, wherein said plasma treating is performed using a pressure range from 1 to 5 Torr and at a total RF power of 600 to 1,000 Watts, using a first RF frequency between 100 kHz and 1 MHz and at least a second RF frequency between 4 MHz and 20 MHz.

3. The method of claim 1, wherein said TFR layer comprises chromium (Cr).

4. The method of claim 3, wherein said TFR layer comprises silicon chromium (SiCr).

5. The method of claim 4, wherein said SiCr further comprises carbon.

6. The method of claim 1, wherein a thickness of said TFR layer is 1 nm to 50 nm.

7. The method of claim 6, wherein said thickness of said TFR layer is 2 nm to 10 nm.

8. The method of claim 1, wherein said depositing said dielectric capping layer comprises utilizing tetraethyl orthosilicate (TEOS) as a precursor material.

9. The method of claim 1, wherein said plasma treating comprises in situ plasma treating said TFR layer in a same system as said depositing said dielectric capping layer.

10. The method of claim 1, wherein said IC includes at least one ferroelectric random access memory (FRAM) cell over said functional circuitry.

11. The method of claim 1, wherein said atomic nitrogen and said atomic hydrogen are generated by flowing $NH_3$ and $N_2$.

12. The method of claim 10, further comprising performing said plasma treating by flowing at least one of $O_2$ to generate atomic O, Argon (Ar) to generate Ar+, and helium (He) to generate $He^+$.

13. The method of claim 1, wherein said forming said pattern on said dielectric capping layer comprises a photoresist pattern, further comprising after said etching said TFR layer ashing said photoresist pattern in oxygen.

14. A method of fabricating an integrated circuit (IC), comprising:
   depositing at least one dielectric liner layer on a substrate including a semiconductor surface layer;
   depositing a thin film resistor (TFR) layer comprising chromium (Cr) on said dielectric liner layer;
   plasma treating said TFR layer with atomic nitrogen and atomic hydrogen with a pressure range from 1 to 5 Torr and at a total RF power of 600 to 1,000 Watts, using a first RF frequency between 100 kHz and 1 MHz and at least a second RF frequency between 4 MHz and 20 MHz;
   depositing a dielectric capping layer comprising silicon oxide on said TFR layer after said plasma treating;

forming a pattern on said dielectric capping layer, and
etching said TFR layer to form at least one resistor that
comprises said TFR layer.

15. The method of claim 14, wherein said depositing said dielectric capping layer comprises utilizing tetraethyl orthosilicate (TEOS) as a precursor material.

16. The method of claim 14, wherein said plasma treating comprises in situ plasma treating said TFR layer in a same system as said depositing said dielectric capping layer.

17. The method of claim 14, wherein said IC includes at least one ferroelectric random access memory (FRAM) cell over said functional circuitry.

18. The method of claim 14, wherein said atomic nitrogen and said atomic hydrogen are generated by flowing $NH_3$ and $N_2$.

19. The method of claim 14, wherein said TFR layer comprises silicon chromium (SiCr).

20. The method of claim 14, wherein a thickness of said TFR layer is 2 nm to 10 nm.

* * * * *